US008021992B2

(12) United States Patent
Liou et al.

(10) Patent No.: US 8,021,992 B2
(45) Date of Patent: Sep. 20, 2011

(54) HIGH ASPECT RATIO GAP FILL APPLICATION USING HIGH DENSITY PLASMA CHEMICAL VAPOR DEPOSITION

(75) Inventors: Joung-Wei Liou, Jhudong Township, Hsinchu County (TW); Tsang-Yu Liu, Kaoshiung (TW); Chien-Feng Lin, Sanchong (TW); Cheng-Liang Chang, Hsing-chu (TW); Ming-Te Chen, Hsing-chu (TW); Chia-Hui Lin, Dajia Township, Taichung County (TW); Ying-Hsiu Tsai, Sihhu Township, Yunlin County (TW); Szu-An Wu, Hsin-Chu (TW); Yin-Ping Lee, Kaoshiung (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 292 days.

(21) Appl. No.: 11/218,695

(22) Filed: Sep. 1, 2005

(65) Prior Publication Data

US 2007/0049034 A1    Mar. 1, 2007

(51) Int. Cl.
   *H01L 21/31* (2006.01)
   *H01L 21/469* (2006.01)
(52) U.S. Cl. ............... 438/788; 438/695; 257/E21.274; 257/E21.275; 257/E21.564
(58) Field of Classification Search ............... 438/694, 438/758, 695, 788, 789, 790; 257/E21.274, 257/E21.279, E21.564
See application file for complete search history.

(56) References Cited

U.S. PATENT DOCUMENTS

| | | | |
|---|---|---|---|
| 4,753,901 A * | 6/1988 | Ellsworth et al. ............. | 438/427 |
| 5,716,890 A * | 2/1998 | Yao ............................... | 438/624 |
| 6,395,150 B1 * | 5/2002 | Van Cleemput et al. | 204/192.37 |
| 6,461,529 B1 * | 10/2002 | Boyd et al. ..................... | 216/67 |
| 6,613,557 B1 | 9/2003 | Frazer et al. | |
| 6,613,657 B1 * | 9/2003 | Ngo et al. ...................... | 438/588 |
| 7,018,908 B2 * | 3/2006 | Sharan et al. .................. | 438/436 |
| 7,163,896 B1 * | 1/2007 | Zhu et al. ...................... | 438/694 |
| 7,189,639 B2 * | 3/2007 | Krishnaraj et al. ............ | 438/627 |
| 7,344,996 B1 * | 3/2008 | Lang et al. .................... | 438/723 |
| 7,381,451 B1 * | 6/2008 | Lang et al. .................... | 427/569 |
| 2001/0001175 A1 * | 5/2001 | Narwankar et al. ........... | 118/300 |
| 2003/0203637 A1 * | 10/2003 | Hua et al. ...................... | 438/694 |
| 2004/0166694 A1 * | 8/2004 | Won et al. ...................... | 438/787 |
| 2004/0266218 A1 * | 12/2004 | Kwon ............................. | 438/778 |
| 2005/0008790 A1 * | 1/2005 | Kapoor et al. ................. | 427/569 |
| 2005/0074946 A1 * | 4/2005 | Chu et al. ....................... | 438/424 |
| 2005/0079715 A1 * | 4/2005 | Hua et al. ....................... | 438/689 |
| 2005/0136617 A1 * | 6/2005 | Jang ................................. | 438/427 |
| 2005/0196976 A1 * | 9/2005 | Rueger et al. .................. | 438/787 |
| 2005/0211669 A1 * | 9/2005 | Lam et al. ....................... | 216/60 |
| 2005/0277265 A1 * | 12/2005 | Cha et al. ........................ | 438/435 |
| 2006/0046427 A1 * | 3/2006 | Ingle et al. ...................... | 438/424 |
| 2006/0054969 A1 * | 3/2006 | Jang et al. ....................... | 257/327 |
| 2006/0177600 A1 * | 8/2006 | Lu et al. .......................... | 427/571 |
| 2006/0178003 A1 * | 8/2006 | Krishnaraj et al. ............ | 438/627 |
| 2007/0049042 A1 * | 3/2007 | Chen et al. ...................... | 438/758 |

FOREIGN PATENT DOCUMENTS

CN    1040063 A    2/1990

* cited by examiner

*Primary Examiner* — Matthew Landau
*Assistant Examiner* — Latanya N Crawford
(74) *Attorney, Agent, or Firm* — Tung & Associates (57) ABSTRACT

A high density plasma chemical vapor deposition process including exciting gas mixture to create a plasma including ions, and directing the plasma into a dense region above the upper surface of the semiconductor wafer, heating the wafer using an additional heat source, and allowing a material from the plasma to deposit onto the semiconductor wafer.

18 Claims, 7 Drawing Sheets

HIGH ASPECT RATIO GAP FILL APPLICATION USING HIGH DENSITY PLASMA CHEMICAL VAPOR DEPOSITION

FIELD OF THE INVENTION

The present invention relates to methods of making semiconductor devices, and more particularly, to methods using high density plasma chemical vapor deposition.

BACKGROUND OF THE INVENTION

Chemical vapor deposition has a range of equipment reactor designs, with each producing slightly different types of film quality. Chemical vapor deposition reactors are broadly categorized based upon the reaction chamber pressure regime used during the operations: Atmospheric-pressure chemical vapor deposition (APCVD) reactors and reduced-pressure reactors. The reduced-pressure chemical vapor deposition reactors are of two general types. First, there is low-pressure chemical vapor deposition (LPCVD) reactors where the energy input is thermal. Second, there are plasma-assisted chemical vapor deposition reactors, either plasma enhanced chemical vapor deposition (PECVD) or high-density plasma chemical vapor deposition (HDPCVD) where the energy is partially supplied by a plasma as well as thermally.

APCVD generally operates in a mass-transport limited regime. At any given time, there may not be sufficient gas molecules present at the wafer surface for a reaction to occur. Therefore, the reactor must be designed to have optimum reactor gas flow to every wafer in the system. The most common use of APCVD is the deposition of silicon dioxide and doped oxides. These films have been used traditionally as an interlayer dielectric, as a protective overcoat, or to planarize a non-uniform surface. APCVD can be utilized to deposit silicon dioxide with silane typically at a low temperature of about 450 to 500° C. Silicon dioxide can also be deposited with TEOS-ozone at a temperature about 400° C.

LPCVD operates at a minimum vacuum of about 4.1 to 5 torr at temperatures ranging between 300 and 900° C. LPCVD reactors typically operate in the reaction-rate limited regime. In this reduced-pressure regime, the diffusivity of the reacting gas molecules increases so that the mass-transfer of the gas to the wafer no longer limits the rate of the reaction. Because of this transfer state, the gas-flow conditions inside the reactor are not important, permitting the reactor design to be optimized for high wafer capacity, for example, wherein wafers can be closely spaced. Films are uniformly deposited on a large number of wafer surfaces as long as the temperature is tightly controlled. LPCVD reactor designs favor a hot-wall reactor type so that the uniform temperature control is achievable of all over a large operating length.

Three major types of chemical vapor deposition equipment rely on plasma energy, in addition to thermal energy to initiate and sustain the chemical reaction necessary for chemical vapor deposition. The plasma-assisted chemical vapor deposition reaction necessary to form a film occurs with RF power is use to breakup gas molecules in a vacuum. The frequency of the RF power depends on the application, with a typical frequencies found at about 40 kHz, 400 kHz, 13.56 MHz and 2.45 GHz (microwave power). The molecular fragments or radicals are chemically reactive species and readily bond to other atoms to form a film at the wafer surface. Gaseous byproducts are removed by a vacuum pumping system. The wafer is heated in order to assist the surface reactions and reduced the level of undesirable contaminants such as hydrogen.

Plasma-enhanced chemical vapor deposition (PECVD) uses plasma energy to create and sustain the chemical vapor deposition reaction. An important difference between PECVD and LPCVD is the much lower PECVD deposition temperature. For instance, silicon nitride is deposited using LPCVD at 800 to 900° C. On the other hand, silicon nitride is deposited using PECVD at a temperature of about 350° C. The PECVD reactor typically is a cold-wall plasma reactor with the wafer heated in its chuck while the remaining parts of the reactor are unheated. Deposition parameters must be controlled to ensure the temperature gradient does not affect the film thickness uniformity. Cold-wall reactors create fewer particles and require a less downtime for cleaning.

High-density plasma chemical vapor deposition (HDPCVD) is a high-density mixture of gases at low pressure that is directed towards the wafer surface in a reaction chamber. The main benefit of HDPCVD is that it can deposit films to fill high aspect ratios with a deposition temperature range of 300-400° C. HDPCVD was initially developed for interlayer dielectric applications, but it has also been used for deposition of ILD-1, shallow trench isolation, etch-stop layers, and deposition of low-k dielectrics. The HDPCVD reaction involves a chemical reaction between two or more gas precursors. To form the high-density plasma, a source excites the gas mixture with RF or microwave power and directs the plasma ions into a dense region above the wafer surface. There are different high-density plasma sources, such as electron cyclotron resonance, inductively coupled plasma, and Helicon. Much of the challenge for the use of high-density plasma is related not only to the performance of the plasma source but also to the details of the chamber designs so that the technology works in high-volume wafer fabrication. A particular problem is that the high-density plasma will increase the thermal load to the wafer. This condition leads to high wafer temperatures. As a result, HDPCVD reactors typically include a cooling system for the wafer, which typically includes applying a backside blanket of helium gas to the wafer through access ports in the electrostatic chuck. This action creates a thermally conductive path between the wafer and the electrostatic chuck, thus cooling the wafer and the chuck.

The HDPCVD oxide process usually uses silane as the silicon precursor and oxygen as the oxygen precursor. Argon is added in the process to enhance the sputtering etch effect. HDPCVD can also deposit PSG and FSG by reacting with phosphorus and silicon tetrafluoride.

Figure 1:
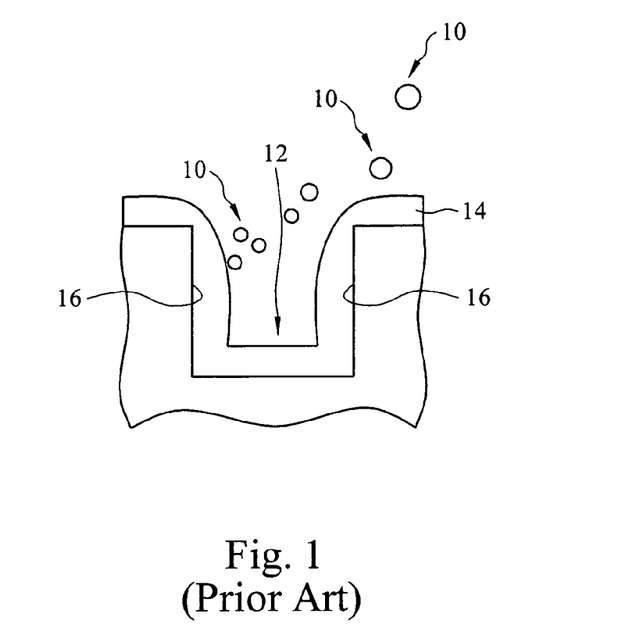
FIGS. 1-3 illustrate a high sputter rate silicon dioxide deposition process of the prior art.
Figure 2:
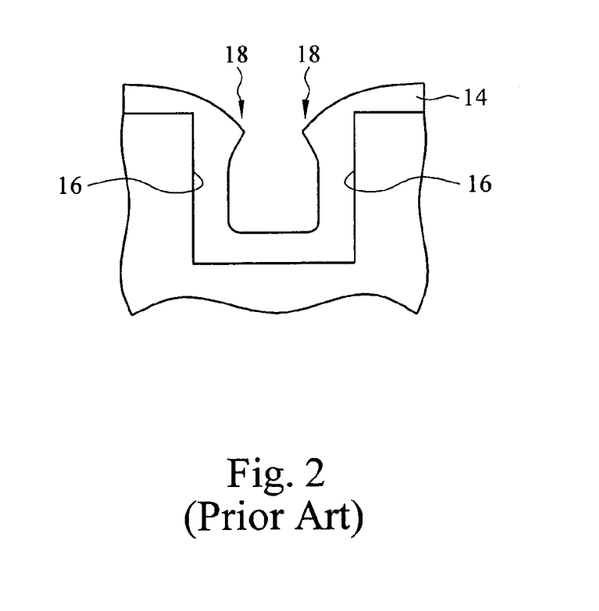
Figure 3:
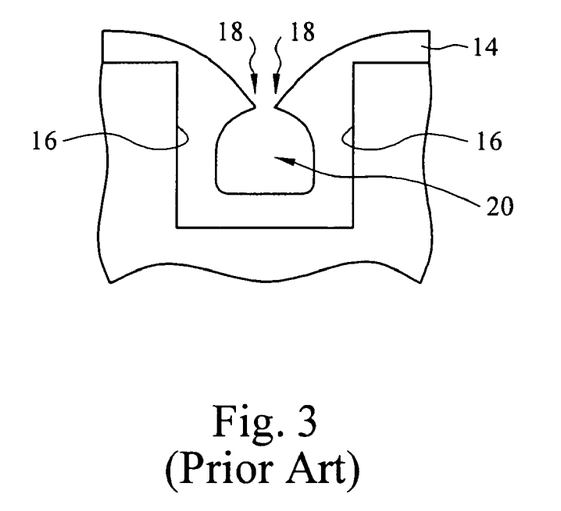

Problems in this sputtering are continued to challenge those skilled in the art. FIG. 1 illustrates a high sputter rate process in which molecules 10 such as silicon dioxide are sputtered into a trench 12 to fill the trench and form a silicon dioxide layer 14. As illustrated in FIG. 1, in a high sputter rate process, the silicon dioxide molecules 10 often bounce off of the corner defining the trench 12 and tend to stick to the sidewalls 16 defined in the trench 12. As a result, as illustrated in FIG. 2, a birds peak 18 tends to develop along the sidewall 16 of the trench. Eventually, sidewall birds peaks 18 converge on each other creating a void 20 in the trench as illustrated in FIG. 3.

Figure 4:
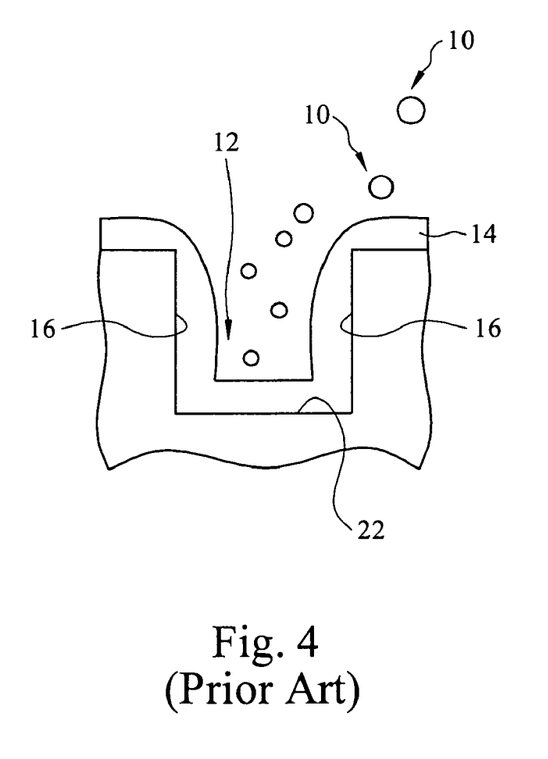
FIGS. 4-6 illustrate a low sputter rate silicon dioxide deposition process of the prior art.
Figure 5:
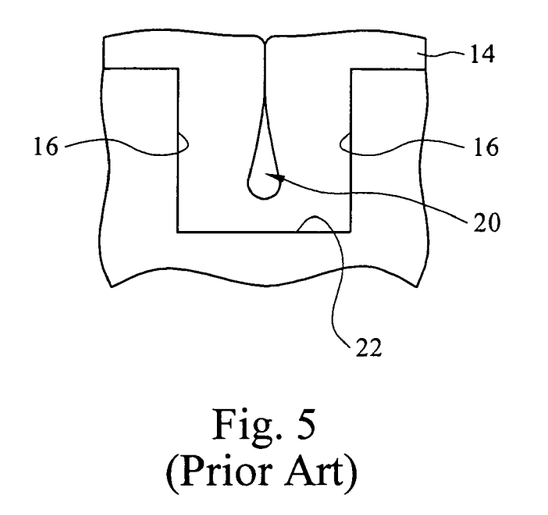
Figure 6:
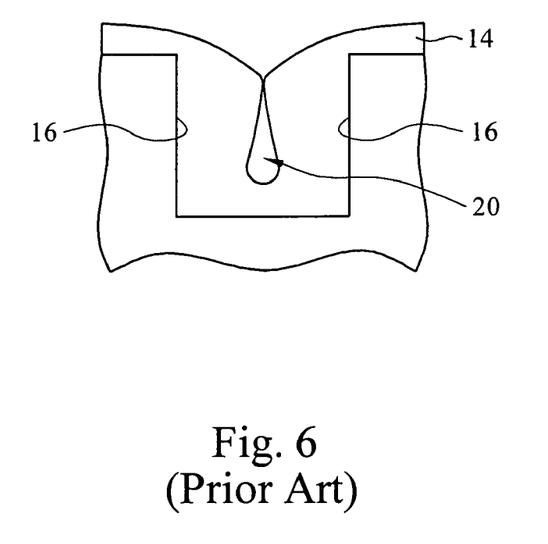

FIG. 4 illustrates a relatively low sputter rate process in which molecules 10, such as silicon dioxide are sputtered into a trench 12. However, in this process because the sputter rate is relatively low, the molecules 10 do not tend to stick to the sidewalls 16 of the trench, but tend to fall towards the bottom 22 of the trench 12. However, even using a relatively low sputter rate process, it's difficult to control the process without producing voids in the trench. FIG. 5 illustrates a void 20 formed in the trench when the deposition to sputter ratio is about 10 for silicon dioxide being deposited in the trench. FIG. 6 illustrates a void 20 that develops when the deposition to sputter ratio is increased to about 20 for silicon dioxide being deposited in the trench.

The present invention provides alternatives to the prior art.

SUMMARY OF THE INVENTION

One embodiment of the present invention includes a high-density plasma chemical vapor deposition process including exciting a gas mixture to create a plasma compromising ions and directing the plasma into a dense region above the upper surface of a semiconductor wafer, heating the wafer using an additional heat source, and allowing material from the plasma to deposit on to the semiconductor wafer.

On another embodiment of the invention the semiconductor wafer includes a layer having an opening therein and wherein the material is deposited into the opening.

On another embodiment of the invention the material is deposited into a trench in the semiconductor wafer to form a shallow trench isolation structure.

Another embodiment of the invention includes a high-density plasma chemical vapor deposition process including exciting a gas mixture to create a plasma comprising ions and directing the plasma into a dense region above the upper surface of a semiconductor wafer and wherein the plasma includes a sputter etchant comprising at least one of helium and hydrogen ions and allowing a material in the plasma to be deposited on the upper surface of the wafer.

Another embodiment of the invention includes a high-density plasma chemical vapor deposition reactor comprising a chamber, a chuck, and a heating means in the chuck.

Another embodiment of the invention includes a high-density plasma chemical vapor deposition reactor comprising a chamber, a source for exciting a gas mixture, a chuck for supporting a wafer and an additional heater in the chamber to supply heat to the semiconductor wafer.

Other embodiments of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 7:
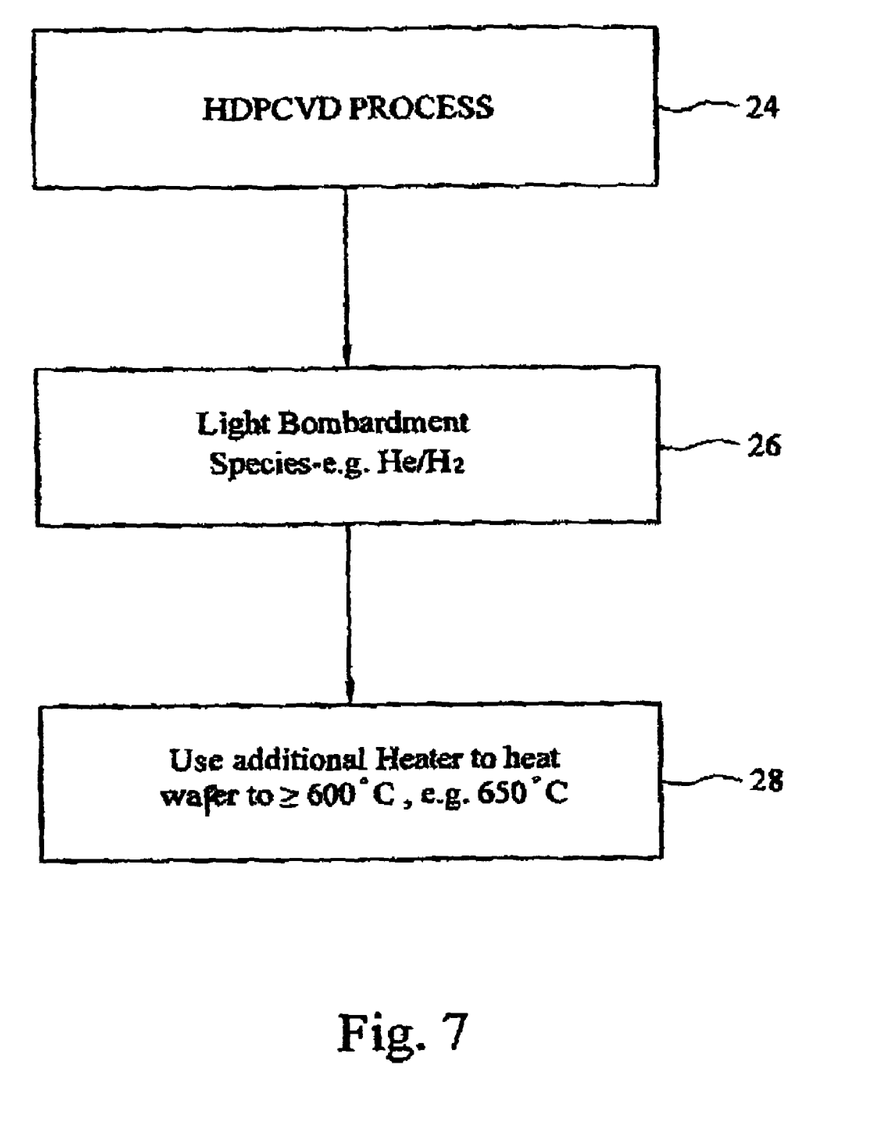
FIG. 7 illustrates one embodiment of the present invention including a high-density plasma chemical vapor deposition process.

Referring now to FIG. 7, one embodiment of the present invention includes a high-density plasma chemical vapor deposition process 24. The plasma and a high-density plasma chemical vapor deposition process is a high-density mixture of gases at low pressure (a few mTorr or less) that is directed towards a semiconductor wafer surface in a reaction chamber. To form the high-density plasma, a source excites the gas mixture with, for example, RF or microwave power and directs the plasma ions into a dense region above the semiconductor wafer surface. There are different high-density plasma sources, such as electron cyclotron resonance, inductively coupled plasma, and Helicon that can be used according to the present invention. The high-density plasma chemical vapor deposition process uses a simultaneous deposition and etching action that is the basis for the ability to accomplish high aspect ratio gap fills with typically dielectric material without any voids. Although hereto forth, high-density plasma chemical vapor deposition processes have used relatively heavy bombardment species such as argon, the present invention includes a light bombardment species 26, such as helium or hydrogen. In one embodiment of the invention, only a light bombardment species is utilized. However, it is within the scope of the present invention to use a combination of heavy bombardment species such as argon and light bombardment species such as helium and/or hydrogen. The light bombardment species are used in the etching process and produce less heat in comparison to heavy bombardment species. One embodiment of the present invention includes the use of an additional heater to heat the semiconductor wafer during the high-density plasma chemical vapor deposition process. In one embodiment, the semiconductor wafer is heated to a temperature equal to or greater than 600° C. In another embodiment of the invention the semiconductor wafer is heated to a temperature greater than 600° C. In another embodiment of the invention, the semiconductor wafer is heated to a temperature greater than 650° C.

Figure 8:
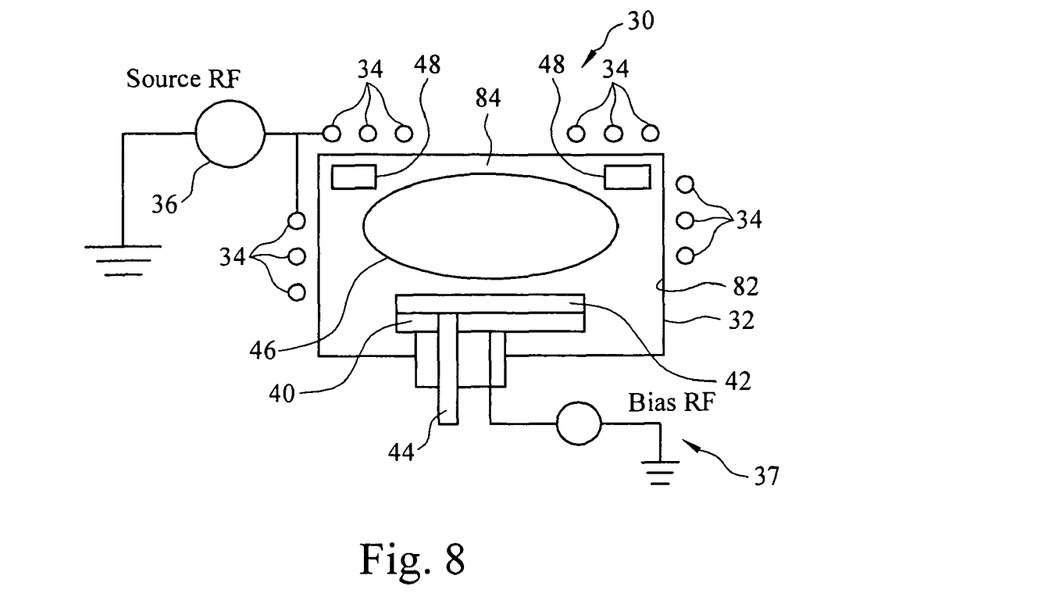
FIG. 8 illustrates one embodiment of the present invention including a high-density plasma chemical vapor deposition reactor.

Referring now to FIG. 8, a high-density plasma chemical vapor deposition reactor 30 is illustrated that include a reaction chamber 32, inductive coils 34, source RF 36 and bias RF 37. The chamber 32 includes sidewalls 82 and a dome 84. A semiconductor wafer chuck 40 is provided on which a semiconductor wafer 42 is supported. A fluid passage 44 is provided to the chuck, which may be utilized for a cooling gas such as helium or may be used for a heating material such as a hot gas or liquid to heat the wafer 42 according to one embodiment of the invention. In one embodiment of the invention a heater 48 is provided on at least one of the sidewalls 82 and/or dome 84 of the chamber 32. The heater 48 may include at least one of a hot gas heat exchanger and a hot liquid heat exchanger. The reactor 30 produces a plasma 46 over the upper surface of a semiconductor wafer 42.

Figure 9:
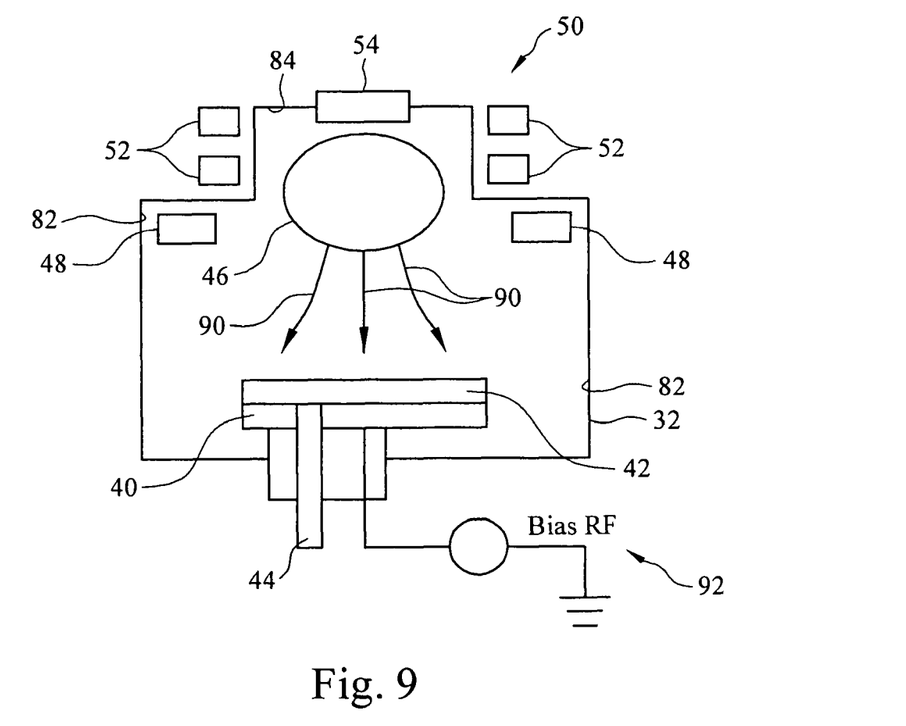
FIG. 9 illustrates one embodiment of the present invention including an alternative high-density plasma chemical vapor deposition reactor.

Referring now to FIG. 9, another embodiment of the present invention includes a high-density plasma chemical vapor deposition reactor 50, which includes a chamber 32 having sidewalls 82 and a dome 84. This embodiment includes a microwave source 54 located in the dome 84. Magnetic coils 52 are provided around the chamber 32 and produce a magnetic field line 90 that directs a plasma 46 produced in the chamber 32. The reactor 50 includes a bias RF 92, and a semiconductor wafer chuck 40 for supporting the semiconductor wafer 42. A fluid passage 44 is provided to the chuck 40 for supplying a cooling fluid such as helium, or in one embodiment of the present invention supplying a heating fluids such as a gas or liquid to the chuck to heat the semiconductor wafer 42. An additional heater 48 is provided on at least one of the sidewalls 82 and/or dome 84 of the chamber 32. The heater 48 may include at least one of a hot gas heat exchanger and a hot liquid heat exchanger.

Figure 10:
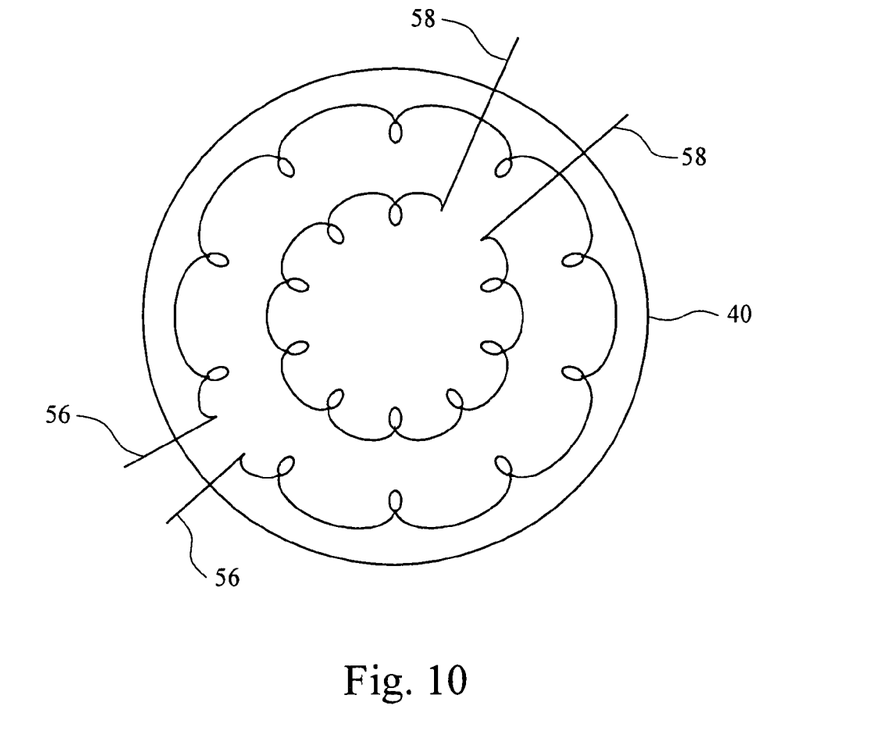
FIG. 10 illustrates one embodiment of the invention including a semiconductor wafer chuck having a first electrical resistance heating element and a second electrical resistance heating element in the chuck.

Referring to FIG. 10, one embodiment of the present invention includes a semiconductor wafer chuck 40, which includes a first electrical resistance heating element 56 positioned near the periphery of the chuck 40. Optionally, a second electrical resistance heating element 58 is provided near the interior of the chuck 40. The first and second electrical resistance heating elements 56, 58 are separately controlled to prevent hotspots in the chuck 40 and a semiconductor wafer.

Figure 11:
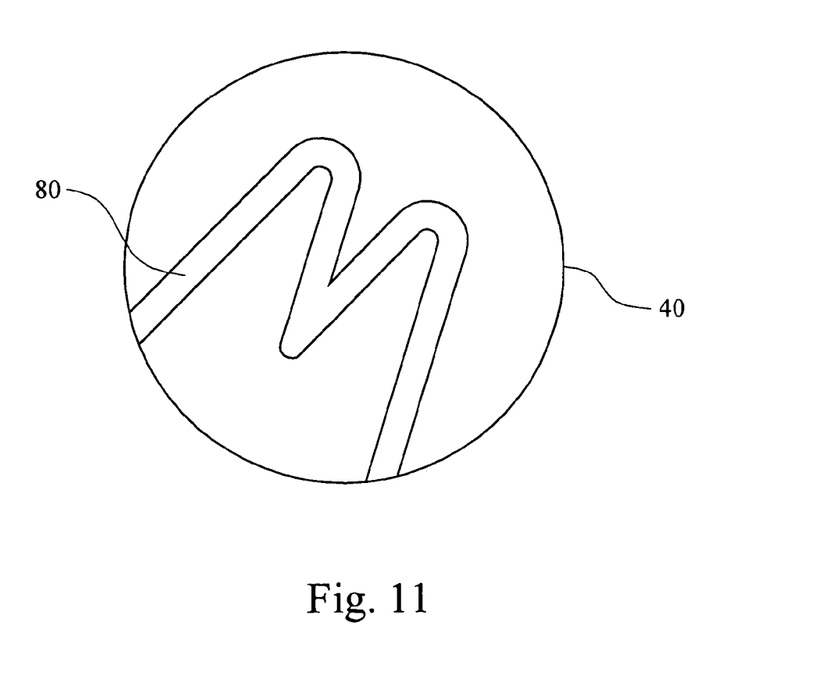
FIG. 11 illustrates one embodiment of the present invention including a semiconductor wafer chuck including a fluid passage defined therein for providing a heating gas and/or liquid for heating a semiconductor wafer on the chuck.

Referring now to FIG. 11, an alternative embodiment of the present invention includes a semiconductor wafer chuck 40 including a fluid passage 80 through which a heating fluid such as a gas or hot liquid may flow to heat the semiconductor wafer during the high-density plasma chemical vapor deposition process.

Figure 12:
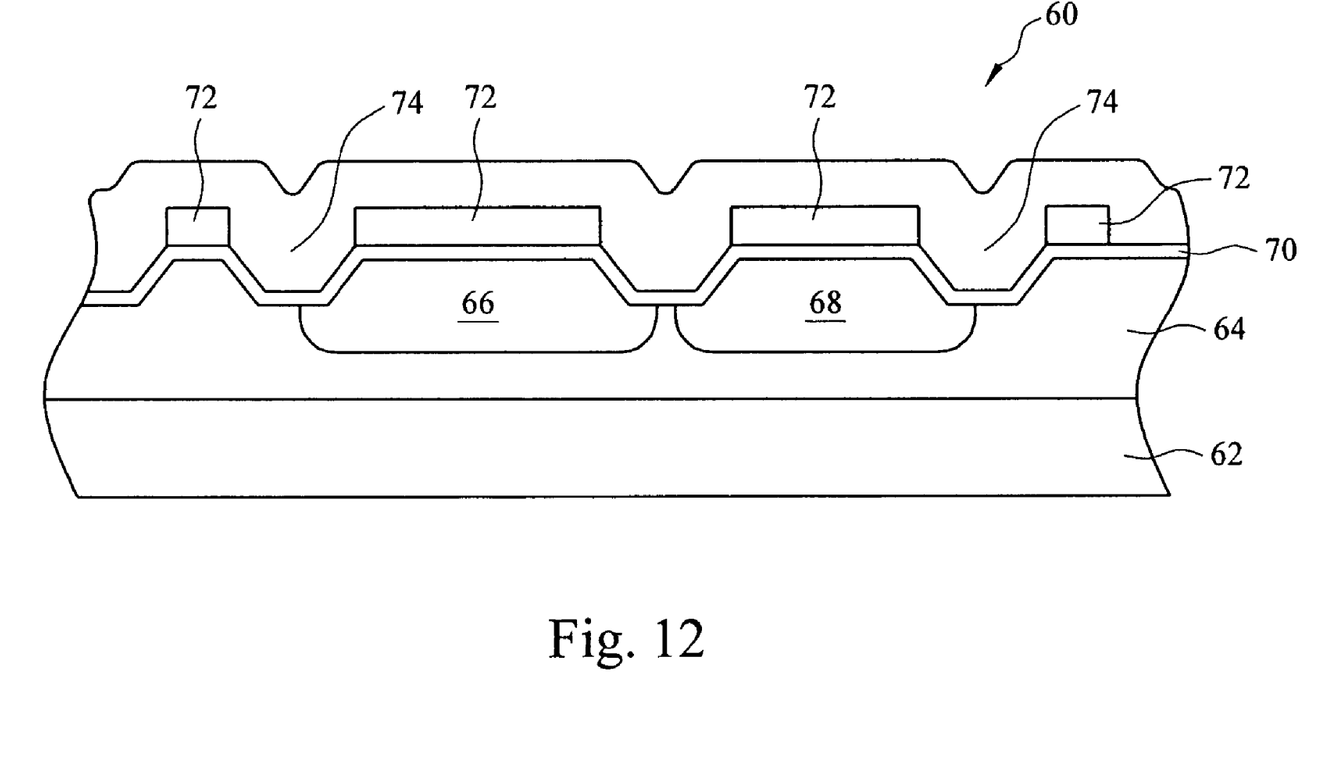
FIG. 12 illustrates a semiconductor device including a shallow trench isolation feature formed according to the present invention.

Referring now to FIG. 12, a semiconductor device 60 is provided including a p+ silicon substrate 62 and an overlying p− epitaxial layer 64 in which a n-well 66 and a p-well 68 have been formed. A liner oxide 70 may be formed over the upper surface of the epitaxial layer 64 and the n-well 66 and the p-well 68. A nitride layer 72 may selectively cover portions of the semiconductor device. A silicon dioxide layer is deposited using a high-density plasma chemical vapor deposition process according to the present invention to form shallow trench isolation features 74.

A gas mixture is introduced into the high density plasma chemical vapor deposition reactors and excited using one of a RF and/or microwave power source. The gas mixture may include any of a variety of materials including, but not limited to silane, oxygen, and a light bombardment species including at least one of helium and hydrogen. Alternatively, the gas mixture may include tetraethylorthosilicate.

What is claimed is:

1. A high density plasma chemical vapor deposition process comprising:
    exciting a gas mixture to create a plasma comprising ions and directing the plasma into a dense region above the upper surface of a semiconductor wafer, said gas mixture comprising oxygen and one of silane and tetraethylorthosilicate;
    allowing a material from the plasma to be simultaneously deposited onto and etched from the semiconductor wafer to result in net deposition of said material while using a heat source in addition to said plasma to heat the semiconductor wafer supported on a semiconductor wafer chuck, said heating during said deposition to a temperature of greater than 600° C.;
    wherein the plasma during said deposition excludes a heavy bombardment species, said heavy bombardment species including argon ions, and wherein said plasma during said deposition comprises a light bombardment sputter etchant species selected from the group consisting of helium ion and hydrogen ions, said plasma not heating said material to reflow during said deposition.

2. A process as set forth in claim 1 wherein the material is deposited into a trench in the semiconductor wafer to form a shallow trench isolation structure.

3. A process as set forth in claim 1 wherein the material comprises undoped silicon dioxide.

4. A process as set forth in claim 1 wherein the gas mixture comprises silane, oxygen and $H_2$.

5. A process as set forth in claim 1 wherein the gas mixture comprises tetraethylorthosilicate.

6. A process as set forth in claim 1 wherein heating the semiconductor wafer comprises supplying electrical resistance heating energy to the semiconductor wafer.

7. A process as set forth in claim 1 further comprising supporting the wafer on a chuck having a fluid passage therein and wherein heating of the semiconductor wafer comprises flowing at least one of a heating gas and a heating liquid through the fluid passage.

8. A process as set forth in claim 1 further comprising a reaction chamber including a wafer chuck and at least one heater element in the chamber, supporting the semiconductor wafer on the wafer chuck and wherein heating of the semiconductor wafer comprises supplying heat from the heater element.

9. A process as set forth in claim 1 wherein the semiconductor wafer is heated to a temperature of greater than 650° C. during said deposition using said heat source.

10. A process as set forth in claim 1 wherein the light bombardment sputter etchant species consists of hydrogen ions.

11. A process as set forth in claim 1 wherein the light bombardment sputter etchant species consists of a mixture of hydrogen ions and helium ions.

12. A high density plasma chemical vapor deposition process comprising:
    exciting a gas mixture to create a plasma comprising ions and directing the plasma into a dense region above the upper surface of a semiconductor wafer, said gas mixture comprising oxygen and one of silane and tetraethylorthosilicate and wherein the plasma includes a sputter etchant comprising at least one of helium and hydrogen ions, and allowing a material in the plasma to be simultaneously deposited on and etched from the upper surface of the semiconductor wafer to result in net deposition of said material while using a heat source in addition to said plasma to heat the semiconductor wafer during said deposition;
    wherein the plasma during said deposition excludes a heavy bombardment species, said heavy bombardment species including argon ions, and wherein said plasma during said deposition includes at least one of at least one of said helium and hydrogen, ions; and
    wherein the semiconductor wafer supported on a semiconductor wafer chuck is heated to a temperature of greater than 650° C. during said deposition using said heat source, said plasma not heating said material to reflow during said deposition.

13. A process as set forth in claim 12 wherein heating the semiconductor wafer comprises supplying electrical resistance heating energy to the semiconductor wafer.

14. A process as set forth in claim 12 wherein heating the semiconductor wafer comprises supporting the semiconductor wafer on a chuck having a fluid passage defined therein and flowing at least one of a heating gas and a heating liquid through the fluid passage.

15. A process as set forth in claim 12 wherein the material deposited comprises undoped silicon dioxide and is deposited into a trench in the semiconductor wafer to form a shallow trench isolation structure.

16. A process as set forth in claim 12 wherein the sputter etchant consists of H2.

17. A process as set forth in claim 12 wherein the sputter etchant consists of hydrogen ions.

18. A process as set forth in claim 12 wherein the sputter etchant consists of a mixture of hydrogen ions and helium ions.

* * * * *